US012660276B2

(12) United States Patent
Ji et al.

(10) Patent No.: US 12,660,276 B2
(45) Date of Patent: Jun. 16, 2026

(54) SEMICONDUCTOR STRUCTURE AND FORMATION METHOD THEREOF

(71) Applicant: Semiconductor Manufacturing International (Shanghai) Corporation, Shanghai (CN)

(72) Inventors: Shiliang Ji, Shanghai (CN); Cheng Tan, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 580 days.

(21) Appl. No.: 18/161,313

(22) Filed: Jan. 30, 2023

(65) Prior Publication Data

US 2023/0245892 A1     Aug. 3, 2023

(30) Foreign Application Priority Data

Jan. 30, 2022     (CN) .......................... 202210113694.4

(51) Int. Cl.
| | |
|---|---|
| *H01L 21/28* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |

(52) U.S. Cl.
CPC ..... *H10D 64/01326* (2026.01); *H10D 30/014* (2025.01); *H10D 30/43* (2025.01); *H10D 30/6735* (2025.01); *H10D 62/121* (2025.01); *H10D 64/017* (2025.01)

(58) Field of Classification Search
None
See application file for complete search history.

(56) References Cited

U.S. PATENT DOCUMENTS

| | | | |
|---|---|---|---|
| 10,510,620 B1 * | 12/2019 | Chanemougame .. | H10D 62/121 |
| 2021/0335671 A1 * | 10/2021 | Wang ................... | H10D 84/038 |
| 2022/0223701 A1 * | 7/2022 | Zhou .................... | H10D 64/018 |

* cited by examiner

*Primary Examiner* — Christine S. Kim
*Assistant Examiner* — Cole Leon Lindsey
(74) *Attorney, Agent, or Firm* — Anova Law Group, PLLC

(57) ABSTRACT

A semiconductor structure includes a substrate, a plurality of gates, a cut isolation structure, and an interlayer dielectric layer. The plurality of gates are formed on the substrate. The plurality of gates extend along a first direction. The cut isolation structure is formed on the substrate. The cut isolation structure passes through the gates in a second direction. A size of the cut isolation structure in the first direction is equal to a predetermined size. The second direction is different from the first direction. The interlayer dielectric layer is formed on the substrate. The interlayer dielectric layer surrounds the gates and the cut isolation structure.

20 Claims, 11 Drawing Sheets

SEMICONDUCTOR STRUCTURE AND FORMATION METHOD THEREOF

CROSS-REFERENCE TO RELATED APPLICATION

This application claims the priority of Chinese Patent Application No. 202210113694.4, filed on Jan. 30, 2022, the entire content of which is hereby incorporated by reference.

FIELD OF THE DISCLOSURE

The present disclosure generally relates to the semiconductor technology field and, more particularly, relates to a semiconductor structure and a formation method thereof.

BACKGROUND

As an integration level of an integrated circuit is getting higher, a size of an integrated circuit device is getting smaller. In recent years, a transistor structure represented by a stacked nanosheet field effect transistor (stacked nanosheet FET) enables the integrated circuit to enter a preparation node below 5 nanometers, which greatly increases a density of semiconductor devices in the integrated circuit.

The stacked nanosheet FET is formed by stacking a plurality of nanoscale sheets over each other. Thus, a metal gate can completely surround a channel region to better reduce leakage and control current to provide a device with better performance and lower power consumption.

The size of the stacked nanosheet FET is very small and has a high arrangement density. Correspondingly, a gate-cut critical size of the stacked nanosheet FET device is reduced to 4 nanometers. However, under the current gate-cut process, it is still difficult to realize a small-scale gate-cut process below 4 nanometers, which limits a process window formed by an advanced preparation device and affects device performance.

BRIEF SUMMARY OF THE DISCLOSURE

The present disclosure provides a semiconductor structure and a formation method thereof to realize a small-size gate-cut process, which improves the performance of the device and optimizes the process window formed by the advanced preparation device.

One aspect of the present disclosure includes a semiconductor structure, including a substrate, a plurality of gates, a cut isolation structure, and an interlayer dielectric layer. The plurality of gates are formed on the substrate. The plurality of gates extend along a first direction. The cut isolation structure is formed on the substrate. The cut isolation structure passes through the gates in a second direction. A size of the cut isolation structure in the first direction is equal to a predetermined size. The second direction is different from the first direction. The interlayer dielectric layer is formed on the substrate. The interlayer dielectric layer surrounds the gates and the cut isolation structure.

Optionally, the predetermined size is less than or equal to 4 nanometers.

Optionally, the first direction and the second direction are perpendicular to each other. The first direction and the second direction are parallel to a surface of the substrate.

Optionally, the substrate includes a base substrate and a channel structure formed on the base substrate. The gates cross over the channel structure. The channel structure extends along the second direction.

Optionally, the channel structure includes a plurality of stacked channel layers. A gate gap exists between two neighboring channel layers.

Optionally, a gate of the plurality of gates is further located in the gate gap between the channel layers.

Optionally, a part of the cut isolation structure is also formed in the interlayer dielectric layer. A size of the cut isolation structure in the interlayer dielectric layer in the first direction is larger than a size of the cut isolation structure in the gate in the first direction.

Another aspect of the present disclosure includes a formation method of a semiconductor structure. The method includes providing a substrate, forming a plurality of dummy gates, an interlayer dielectric layer, and an initial cut isolation structure on the substrate, removing the dummy gates, forming a gate trench in the interlayer dielectric layer, forming a plurality of dummy gates, an interlayer dielectric layer, and an initial cut isolation structure on the substrate, performing a thinning process on a sidewall of the initial cut isolation structure exposed in the gate trench to form a cut isolation structure, and after the thinning process, forming a plurality of gates in gate trenches. The dummy gates extend along a first direction. The initial cut isolation structure passes through the dummy gates in a second direction. The second direction is different from the first direction. The interlayer dielectric layer surrounds the dummy gates and the initial cut isolation structure. A size of a part of the cut isolation structure located in the gate trench along the first direction reaches a predetermined size.

Optionally, the substrate includes a base substrate and a channel structure formed on the base substrate. The channel structure includes a plurality of sacrificial layers and a channel layer formed between two neighboring sacrificial layers.

Optionally, the method further includes, after the thinning process and before forming the gates, removing a sacrificial layer exposed by the gate trench to form a gate gap.

Optionally, the gate is also formed in the gate gap.

Optionally, the initial cut isolation structure is formed before the dummy gates and the interlayer dielectric layer are formed.

Optionally, forming the dummy gates, the interlayer dielectric layer, and the initial cut isolation structure includes forming a dummy gate material layer on the substrate, forming a cut trench extending along the second direction in the dummy gate material layer, forming the initial cut isolation structure in the cut trench, patterning the dummy gate material layer to form the plurality of dummy gates extending along the first direction, and forming the interlayer dielectric layer surrounding the dummy gates and the initial cut isolation structure on the substrate.

Optionally, a size of the cut trench along the first direction ranges from 4 nanometers to 40 nanometers.

Optionally, the cut trench is formed between two channel structures. Distances from the two channel structures neighboring to the cut trench to a sidewall of the cut trench are equal.

Optionally, forming the cut trench includes forming a mask layer exposing a part of the dummy gate material layer on the dummy gate material layer, and using the mask layer as a mask to etch the dummy gate material layer by an anisotropic dry etching process to form the cut trench.

Optionally, the initial cut isolation structure is formed after the dummy gates and the interlayer dielectric layer are formed.

Optionally, a distance between two channel structures in the first direction ranges from 10 nanometers to 30 nanometers.

Optionally, the predetermined size is less than or equal to 4 nanometers.

Optionally, performing the thinning process on the sidewall of the initial cut isolation structure in the gate trench includes a wet etching process or an isotropic dry etching process.

As disclosed, the technical solutions of the present disclosure have the following advantages.

In the formation method of the semiconductor structure provided by the technical solution of the present disclosure, since the cut trench first formed in the dummy gate material layer has a large size, the reliability of the formation process of the cut trench is high, the process window is large, and the size of the formed cut trench is more uniform. Compared with the process of directly etching the small-size gate cut trench, the formation process of embodiments can include forming the initial cut isolation structure in the cut trench, and performing then the thinning process on the initial cut isolation structure to reach the predetermined size. Thus, the thickness of the cut isolation structure can be more effectively controlled, the difficulty of the photolithographic patterning process is reduced, the process reliability is improved, and the formed cut isolation structure is more uniform in shape. In addition, since the size of the cut trench formed first in the dummy gate material layer is relatively large, the position of the cut trench can be located more easily. Thus, the cut trench can be better formed between the neighboring channel structures at the central axis, which optimizes the process window for subsequently forming the cut isolation structure and improves the performance of the device.

Further, the cut isolation structure can achieve a predetermined isolation thickness of 4 nanometers. Thus, a precision gate cut process can be realized for the small-size device, which optimizes the process window of the advanced process device and improves the performance of the device.

Further, in the formation method of the semiconductor structure, the dummy gate material layer, the cut trench located in the dummy gate material layer, and the initial cut isolation structure are formed first. Then, the dummy gates and the interlayer dielectric layer are formed. Thus, in forming the cut trench, etching only needs to be performed on the dummy gate material layer, which optimizes the uniformity of the shape of the cut trench and improves the stability of the process.

In the semiconductor structure of the technical solution of the present disclosure, the size of the cut isolation structure passing through the gates along the first direction is equal to the predetermined size. Thus, the precision gate cut process of the small-size device can be realized, the process window formed by the advanced preparation device can be optimized, and the performance of the device can be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

As described in the background, under the current gate cut process, it is still difficult to realize the small size gate cut process below 4 nanometers, which limits the process window formed by the advanced preparation device and affects the device performance.

To solve the above technical problems, embodiments of the present disclosure provide a formation method of a semiconductor structure. First, a cut trench with a relatively large size can be formed in a dummy gate material layer, and an initial cut isolation structure can be formed in the cut trench. Then, a thinning process can be performed on the initial isolation structure to reach a predetermined isolation thickness to form a cut isolation structure with a small size. In the formation method, the thickness of the cut isolation structure can be effectively controlled to realize the precision gate cut process of the small device, which improves the device performance and optimizes the process window.

To make the above objects, features, and beneficial effects of the present disclosure comprehensible, embodiments of the present disclosure are described in detail below in connection with the accompanying drawings.

FIGS. 1 to 10 illustrate schematic structural diagrams showing cross-sections of forming a semiconductor structure according to embodiments of the present disclosure.

Figure 1:
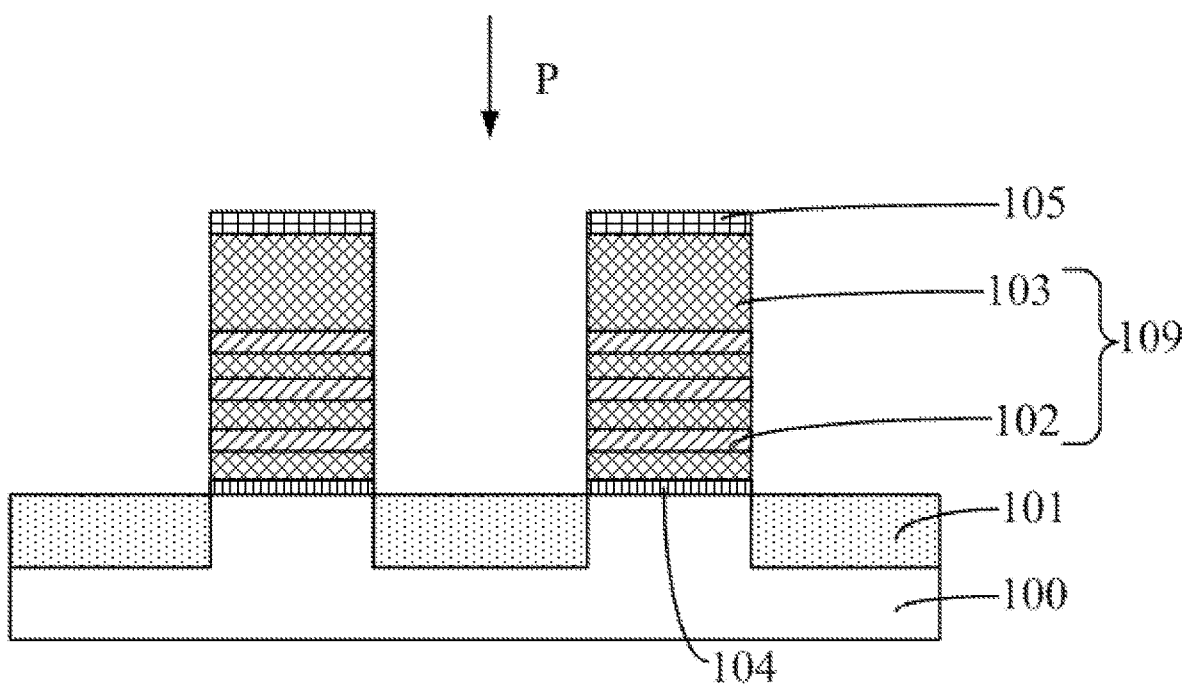
FIGS. 1 to 10 illustrate schematic structural diagrams showing cross-sections of forming a semiconductor structure according to embodiments of the present disclosure.
Figure 2:
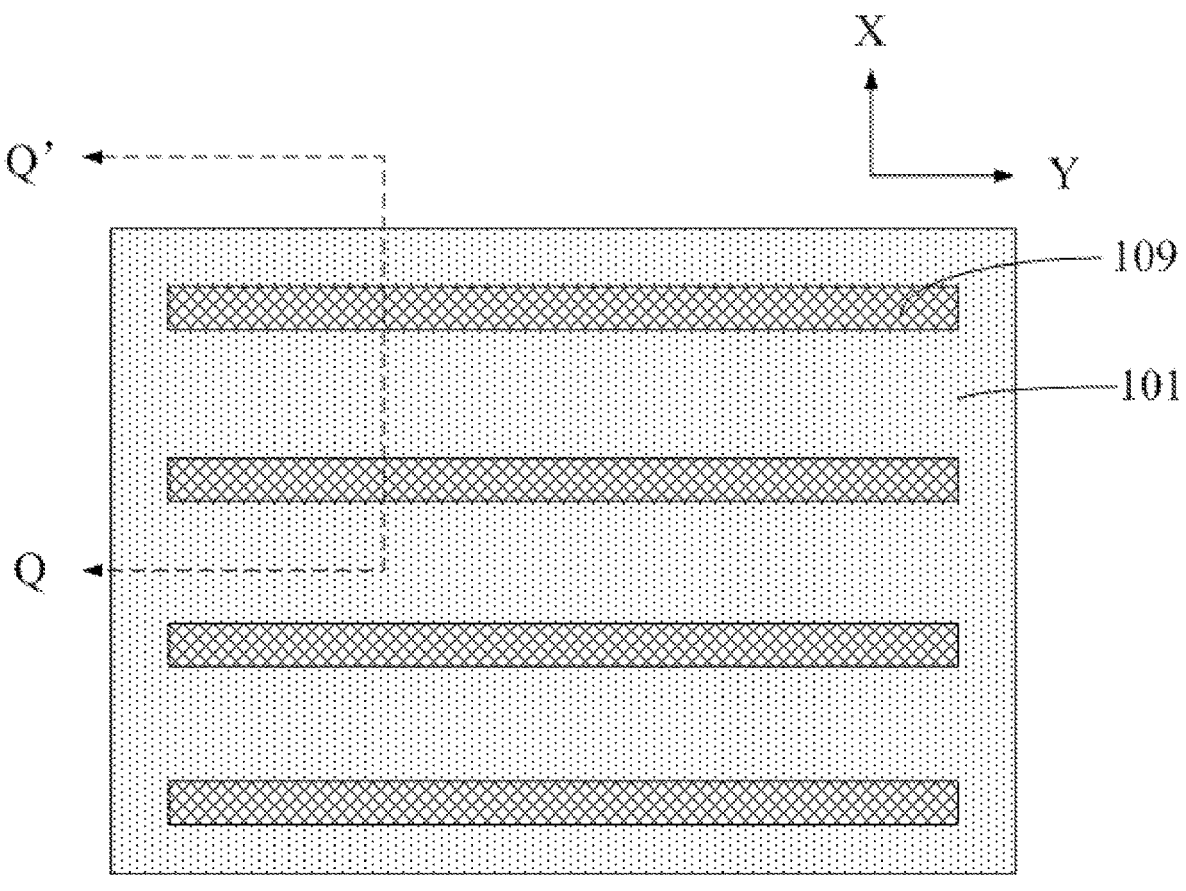
Figure 11:
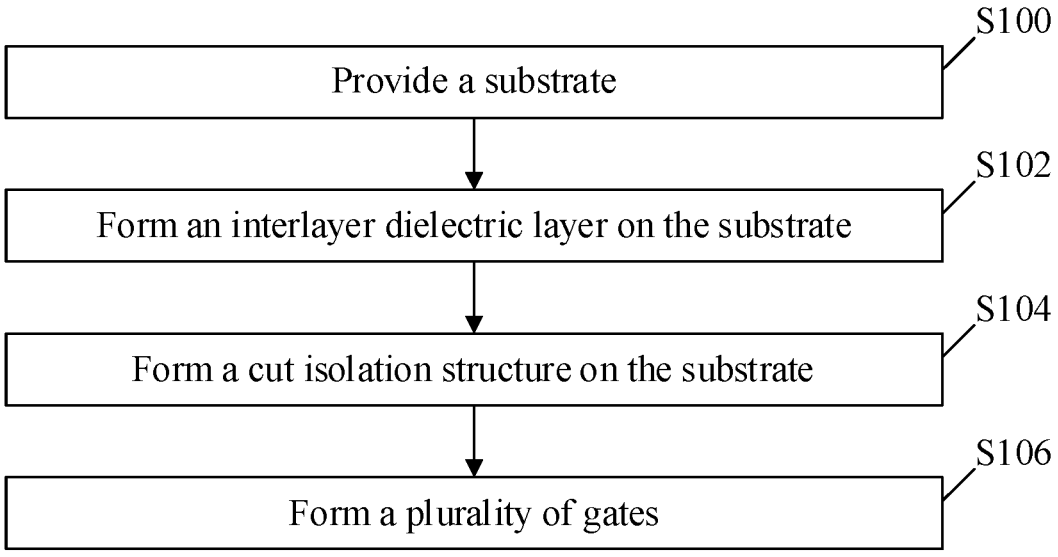
FIG. 11 illustrates an exemplary process for forming a semiconductor structure consistent with the disclosed embodiments of the present disclosure.

As shown in FIG. 11, a substrate is provided (S100). FIG. 1 and FIG. 2 illustrate the corresponding structures.

With reference to FIG. 1 and FIG. 2, FIG. 1 is a schematic cross-sectional structural diagram of FIG. 2 along direction QQ'. FIG. 2 is a top view of FIG. 1 along direction P.

Two different directions parallel to a surface of the substrate can be referred to as first direction X and second direction Y. In some embodiments, first direction X and second direction Y can be perpendicular to each other.

In some embodiments, the substrate can include a base substrate 100 and a channel structure 109 formed on the base substrate 100. The channel structure 109 can include a plurality of stacked sacrificial layers 103 and a channel layer 102 arranged between two neighboring sacrificial layers 103. Channel layers 102 that are stacked can be beneficial for a subsequently formed gate to better control the current.

A material of the base substrate 100 can include silicon, silicon germanium, silicon carbide, silicon on insulator (SOI), germanium on insulator (GOI), etc. In some embodiments, the material of the base substrate 100 can be silicon.

A material of the channel layer 102 can include silicon. A material of the sacrificial layer 103 can include silicon germanium.

In some embodiments, the channel structure 109 can extend along second direction Y. A size of the channel structure 109 along first direction X can range from 10 nm to 20 nm. A distance between two channel structures 109 in first direction X can range from 10 nm to 30 nm.

In some embodiments, a surface of the base substrate 100 and a surface of the channel structure 109 can also include a passivation layer (not shown). The passivation layer can be used to protect the base substrate 100 and the channel structure 109 during the formation process of the semiconductor structure. A material of the passivation layer can include silicon oxide or silicon nitride.

In some embodiments, a bottom isolation layer 104 can be formed between the base substrate 100 and the channel structure 109 to prevent leakage of the channel layer 102. A material of the bottom isolation layer 104 can include silicon dioxide.

In some embodiments, a top surface of the channel structure 109 can further include a channel mask layer 105. The channel mask layer 105 can be used as a mask during the formation process of the channel structure 109.

In some other embodiments, the channel structure can be a fin structure made of a same material. The material of the channel structure can include silicon.

An initial isolation dielectric layer (not shown) can be formed on the substrate. The initial isolation dielectric layer can surround the channel structure 109. A thinning process can be performed on the initial isolation dielectric layer to form an isolation dielectric layer 101. The isolation dielectric layer 101 can expose at least a part of the channel structure 109. A material of the isolation dielectric layer 101 can include silicon oxide.

To facilitate understanding, the channel mask layer 105 is not shown in FIG. 2.

In some embodiments, a plurality of dummy gates, an interlayer dielectric layer, and an initial cut isolation structure can be subsequently formed on the substrate. The dummy gates can extend along the first direction. The initial cut isolation structure can pass through the dummy gates in the second direction. The second direction can be different from the first direction. The interlayer dielectric layer can surround the dummy gates and the initial cut isolation structure.

In some embodiments, the initial cut isolation structure can be formed before the dummy gates and the interlayer dielectric layer are formed. In some other embodiments, the initial cut isolation structure can be formed after the dummy gates and the interlayer dielectric layer are formed.

As shown in FIG. 11, the interlayer dielectric layer is formed on the substrate (S102), and a cut isolation structure is formed on the substrate (S104). FIG. 3 to FIG. 7 illustrate the corresponding structures.

In some embodiments, as shown in FIGS. 3 to 7, the dummy gates, the interlayer dielectric layer, and the initial cut isolation structure are formed.

Figure 3:
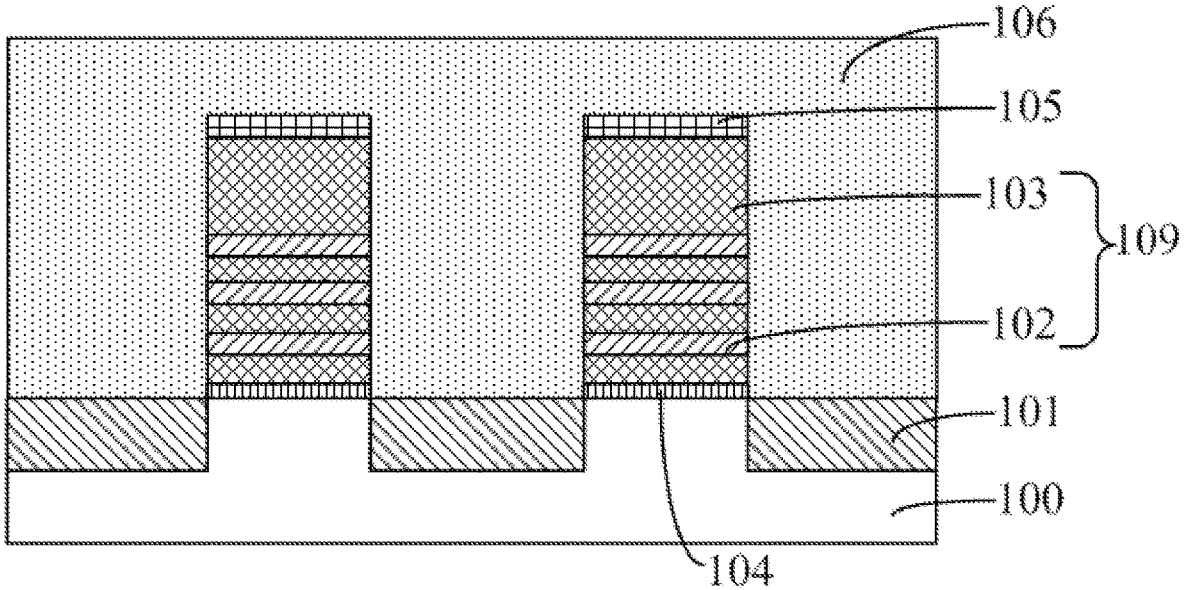

With reference to FIG. 3, FIG. 3 and FIG. 1 have the same viewing direction. A dummy gate material layer 106 is formed on the substrate.

In some embodiments, the dummy gate material layer 106 can be formed on the isolation dielectric layer 101.

The formation method of the dummy gate material layer 106 can include forming an initial dummy gate material layer (not shown) on the isolation dielectric layer 101. The initial dummy gate material layer can surround the channel structure 109. The top of the initial dummy gate material layer can be higher than the top of the channel structure 109. The method can further include performing chemical mechanical polishing on the initial dummy gate material layer to form the dummy gate material layer 106.

In some embodiments, a material of the dummy gate material layer 106 can include polysilicon.

In some embodiments, the formation method of the semiconductor structure can further include forming an initial gate mask layer (not shown) on the dummy gate material layer 106 and forming an upper layer dielectric layer (not shown) on the initial gate mask layer. In a subsequent process, the gate mask layer can be formed by patterning the initial gate mask layer, which can be then used to etch the dummy gate material layer 106 to form a dummy gate.

Figure 4:
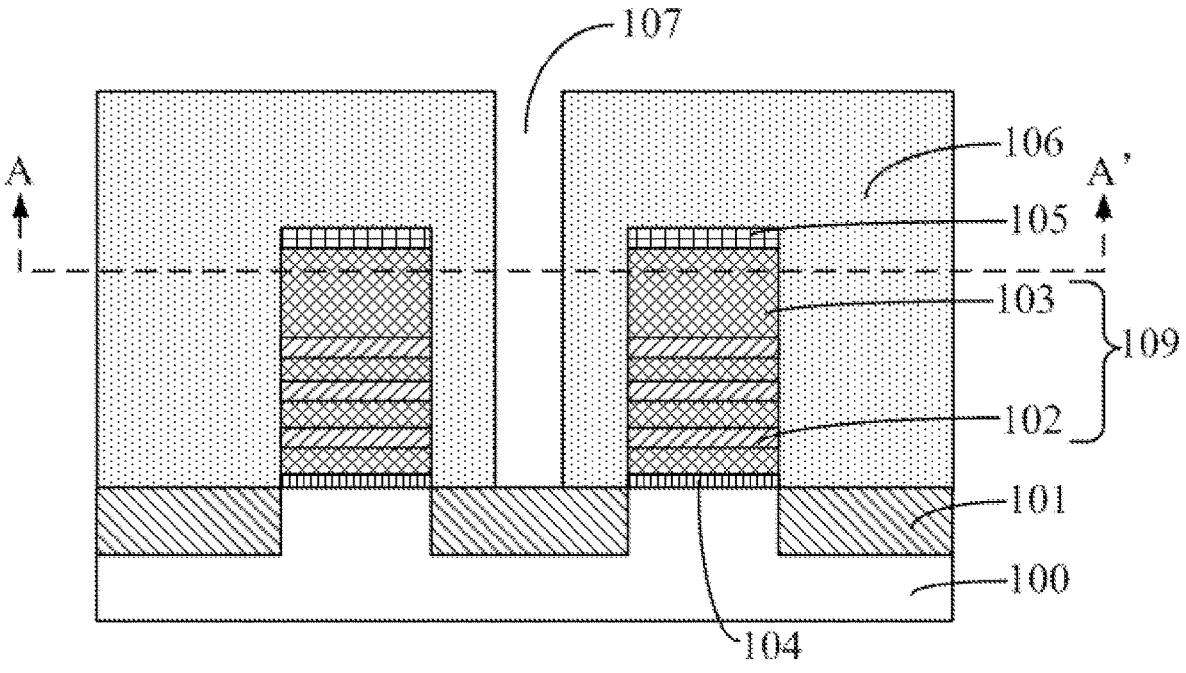
Figure 5:
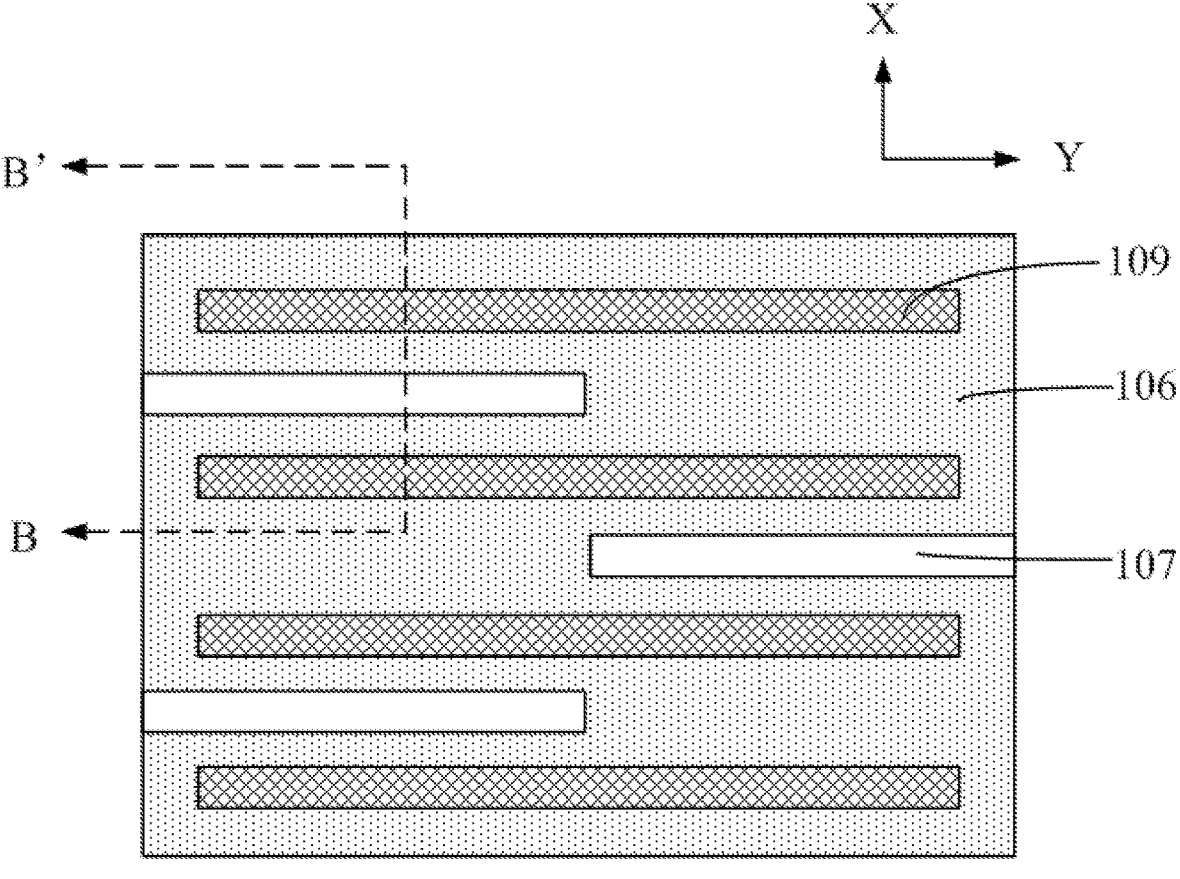

With reference to FIG. 4 and FIG. 5, FIG. 4 is a schematic cross-sectional structural diagram of FIG. 5 along direction BB'. FIG. 5 is a schematic cross-sectional structural diagram of FIG. 4 along direction AA'. A cut trench 107 extending along direction AA' is formed in the dummy gate material layer 106.

The cut trench 107 can provide a space for a cut isolation structure that is formed subsequently. Thus, after the gate is formed, the gate can be cut off. The cut trench 107 can pass through the dummy gate material layer 106 in a direction perpendicular to the surface of the substrate. Thus, the cut isolation structure that is subsequently formed can be used to effectively cut the gate.

Meanwhile, the cut trench 107 can be also used to locate the position of the cut isolation structure.

In some embodiments, the cut trench 107 can be formed between two channel structures 109. The distances from the two channel structures 109 neighboring to the cut trench 107 to a sidewall of the cut trench 107 can be equal. Thus, the cut isolation structure that is subsequently formed can be used to cut the gate into a plurality of uniform and separate members to ensure the stability of the device.

In some embodiments, the size of the cut trench 107 along first direction X can range from 4 nanometers to 40 nanometers. Since the size range is wide, an appropriate size of the cut trench 107 can be selected according to a photolithography process and the precision of the apparatus. Thus, difficulty of a photolithography patterning process can be reduced, and the process flexibility can be improved. Moreover, the size of the cut trench 107 can be more uniform, which results in a smoother shape and optimizes the process window. In addition, since the size range of the cut trench 107 is close to a distance range between the channel structures 109 along first direction X, the position of the cut trench 107 can be located more easily. Thus, the cut trench 107 can be better formed at a middle line between the neighboring channel structures 109, which optimizes the process window for subsequently forming the cut isolation structure and improves the performance of the device.

In some embodiments, the formation method of the cut trench 107 can include forming a mask layer exposing a part of the dummy gate material layer 106 on the dummy gate material layer 106 and using the mask layer as a mask to etch the dummy gate material layer 106 by an anisotropic dry etching process to form the cut trench 107.

In some embodiments, the size of the cut trench 107 along second direction Y can be smaller than the size of the channel structure 109 along second direction Y. The cut trenches 107 can be divided into two groups, i.e., first cut trenches and second cut trenches, respectively. The first cut trenches and the second cut trenches can be arranged alternately. Positions of cut trenches 107 in the same group can coincide with each other in second direction Y, and positions of the cut trenches 107 in the same group can be different in first direction X. Positions of cut trenches 107 in different groups may not overlap with each other in second direction Y, and positions of the cut trenches 107 in different groups can be different in first direction X.

In some other embodiments, the sizes of the cut trenches can be the same along second direction Y. The sizes of the cut trenches along second direction Y can be greater than or equal to the sizes of the channel structures along second direction Y. The positions of the cut trenches in second direction Y can coincide with each other.

In some embodiments, before the dummy gate material layer 106 is etched by the etching process, the upper dielectric layer and the initial gate mask layer can be also etched.

Figure 6:
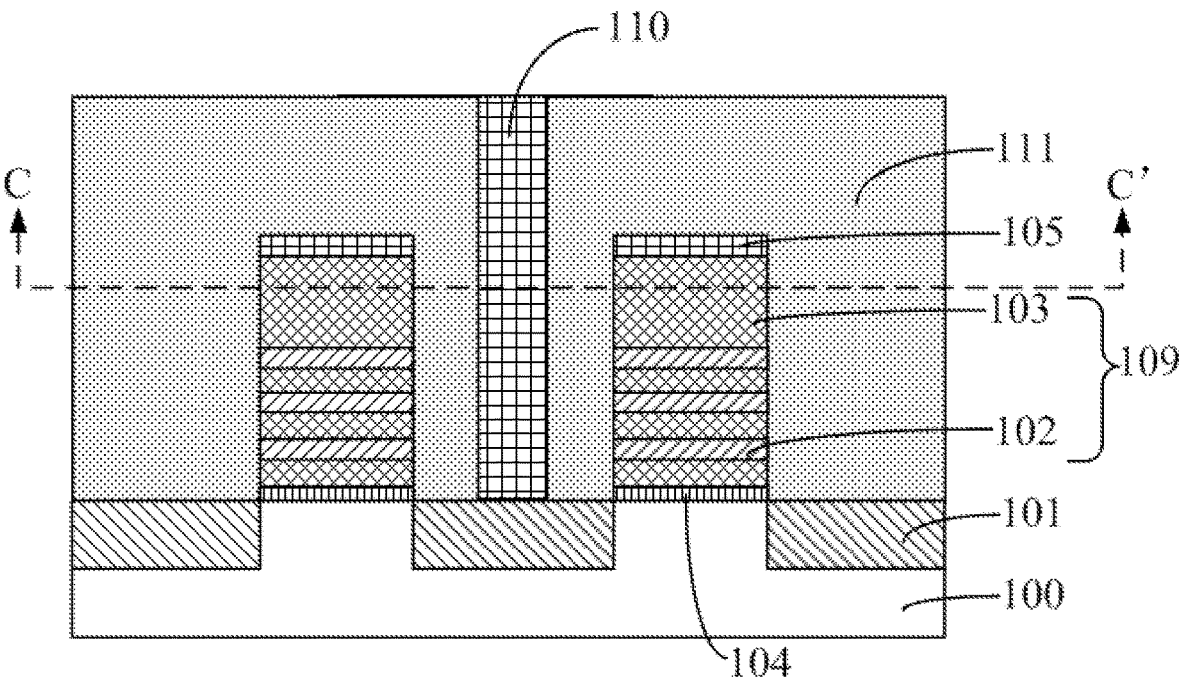
Figure 7:
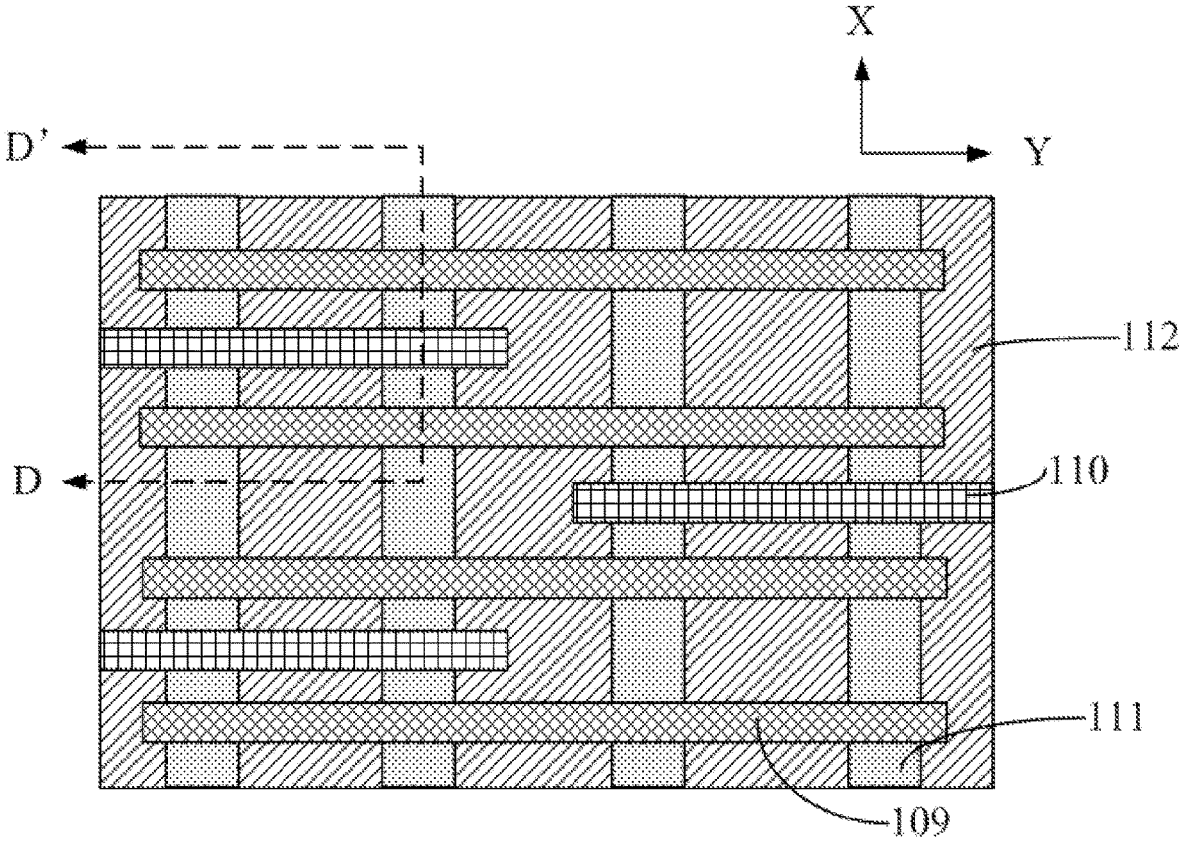

With reference to FIG. 6 and FIG. 7, FIG. 6 is a schematic cross-sectional structural diagram of FIG. 7 along direction DD', and FIG. 7 is a schematic cross-sectional structural schematic diagram of FIG. 6 along direction CC'. The initial cut isolation structure 110 is formed in the cut trench 107.

The formation method of the initial cut isolation structure 110 can include forming an initial isolation material layer (not shown) in the cut trench 107. The initial isolation material layer can be also formed on the upper dielectric layer. The method can further include performing planarization on the initial isolation material layer and the upper dielectric layer until the initial gate mask layer is exposed and forming the initial cut isolation structure 110 in the cut trench 107.

In some embodiments, a material of the initial cut isolation structure 110 can include silicon nitride.

With still reference to FIG. 7, the dummy gate material layer 106 is patterned to form a plurality of dummy gates 111 extending along first direction X.

Since first direction X is perpendicular to second direction Y, the dummy gates 111 can cross over the channel structure 109. Meanwhile, the initial isolation structure 110 can pass through the dummy gates 111 to divide the dummy gates 111 into a plurality of discrete members.

After forming the dummy gates 111, the formation method of the semiconductor structure can further include forming source-drain regions (not shown) on two sides of a dummy gate 111, a sidewall (not shown) on the surface of the dummy gate 111, and an epitaxial layer (not shown) on the source-drain regions.

Then, an interlayer dielectric layer 112 can be formed to surround the dummy gates 111, the initial cut isolation structure 110, and the channel structure 109. The top of the interlayer dielectric layer 112 can be flush with the top of the initial cut isolation structure 110. Therefore, a part of the initial cut isolation structure 110 can be located in the dummy gates 111, and the rest of the initial cut isolation structure 110 can be located in the interlayer dielectric layer 112.

A material of the interlayer dielectric layer 112 can include silicon oxide.

In some embodiments, the initial cut isolation structure 110 can be formed before the dummy gates 111 and the interlayer dielectric layer 112 are formed. The dummy gate material layer 106, the cut trench 107 in the dummy gate material layer 106, and the initial cut isolation structure 110 can be formed first. Then, the dummy gates 111 and the interlayer dielectric layer 112 can be formed. Thus, in the process of forming the cut trench 107, only etching may need to be performed on the dummy gate material layer 106. Thus, the process difficulty can be reduced. Moreover, since etching only needs to be performed on the same material, the uniformity of the shape of the cut trench 107 can be optimized. Thus, the shape of the subsequently formed cut isolation structure can be improved, the process stability can be improved, and the process window can be optimized.

Figure 8:
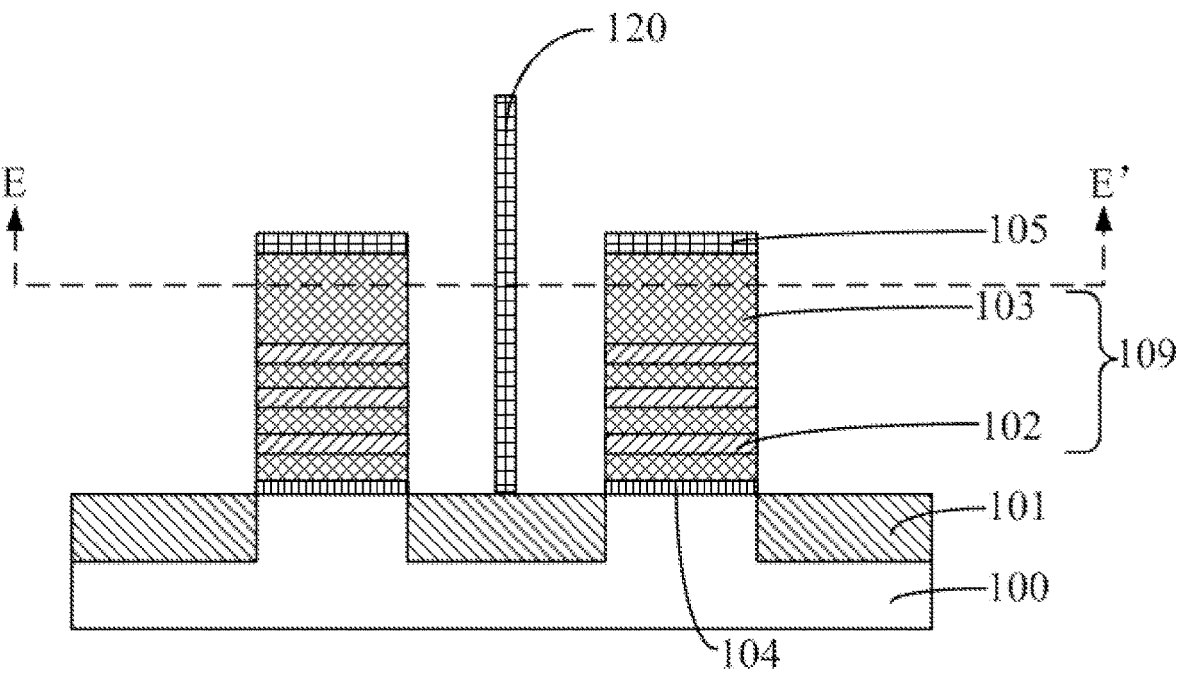
Figure 9:
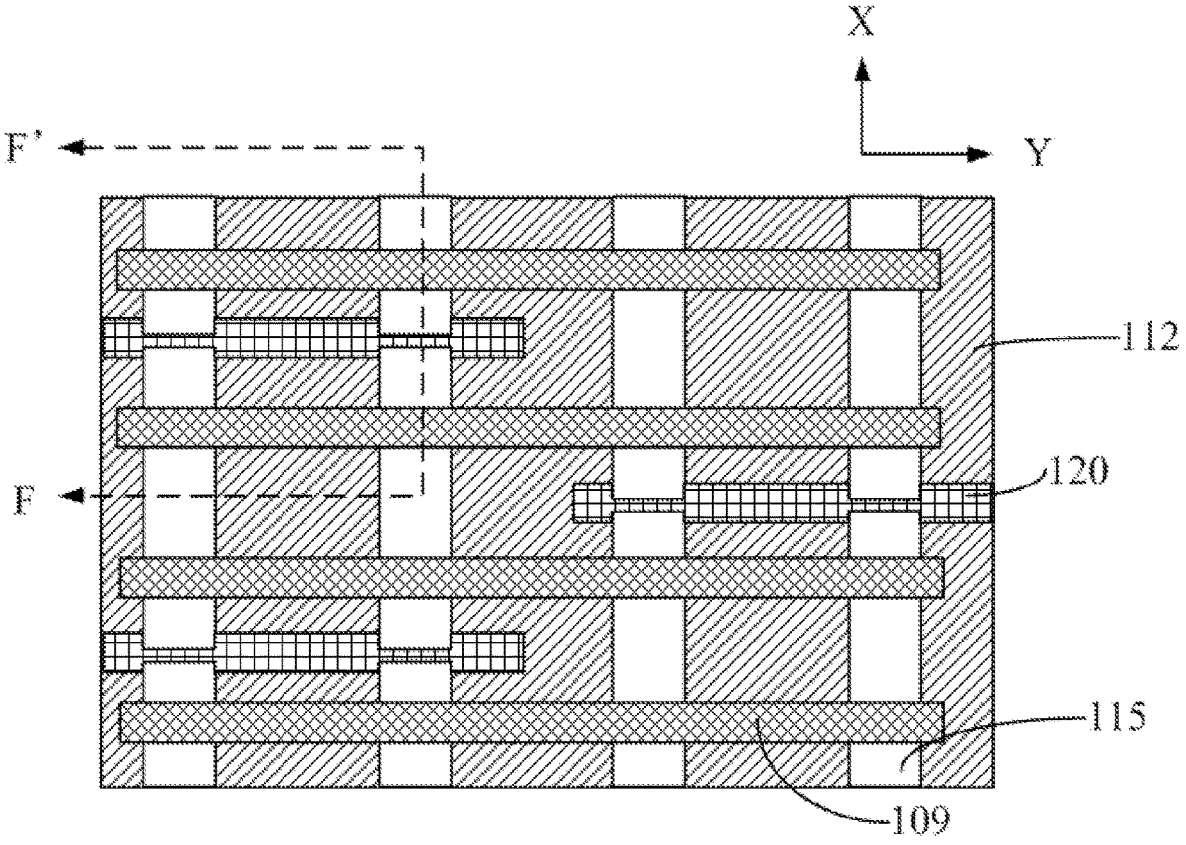

As shown in FIG. 11, a plurality of gates are formed (S106). A part of the cut isolation structure in the gate trench can have a size reaching the predetermined size along first direction X. FIG. 8 and FIG. 9 illustrate the corresponding structures.

With reference to FIG. 8 and FIG. 9, FIG. 8 is a schematic cross-sectional structural diagram of FIG. 9 along direction FF', and FIG. 9 is a schematic cross-sectional structural diagram of FIG. 8 along direction EE'. The dummy gates 111 are removed, and the gate trench 115 is formed in the interlayer dielectric layer 112. A thinning process is performed on the sidewall of the initial cut isolation structure 110 exposed in the gate trench 115 to form cut isolation structure 120. A part of the cut isolation structure 120 in the gate trench 115 can have a size reaching the predetermined size along first direction X.

In the subsequent formation process, a gate can be formed in the gate trench 115.

A part of the initial cut isolation structure 110 can be exposed in the gate trench 115. A size range of the initial cut isolation structure 110 along first direction X can be from 4 nanometers to 40 nanometers.

In some embodiments, the predetermined size can be less than or equal to 4 nanometers, which meets the precision gate cut process requirements of the advanced preparation device below 5 nanometers. Thus, higher device integration and better performance can be achieved.

Since the size of the cut trench 107 that is first formed in the dummy gate material layer 106 is relatively large, the formation process of the cut trench 107 can have high reliability, the process window can be large, and the size of the formed cut trench 107 can be more uniform. Moreover, the cut trench 107 can be better formed at the center axis between two neighboring channel structures 109. In the formation process of embodiments of the present disclosure, the initial cut isolation structure 110 with a large size can be formed in the cut trench 107 first. Then, the thinning process can be performed on the initial cut isolation structure 110 to reach the predetermined size. Thus, the thickness of the cut isolation structure 120 can be more effectively controlled. Thus, the cut isolation structure 120 of a small size below 4 nanometers can be prepared. The process reliability can be improved. The method can be used to reduce the difficulty of the photolithographic patterning process. Thus, the shape of the formed cut isolation structure 120 can be more uniform, the process window can be optimized, and the performance of the device can be improved.

In some embodiments, performing the thinning process on the sidewall of the initial cut isolation structure 110 in the gate trench 115 can include a wet etching process or an isotropic dry etching process.

Since the formation process of the cut trench 107 and the thinning process of the sidewall of the initial cut isolation structure 110 can be performed by using the existing relatively mature process conditions, the process cost and difficulty can be further reduced. Thus, these processes can have a broader application scope.

The thinning process can be only performed on the initial cut isolation structure 110 exposed in the gate trench 115 to form the cut isolation structure 120, while the thinning process may not be performed on the initial cut isolation structure 110 in the interlayer dielectric layer 112. To facilitate understanding, the initial cut isolation structure 110 in the interlayer dielectric layer 112 can be also referred to as a cut isolation structure 120. Thus, the size of the cut isolation structure 120 in the interlayer dielectric layer 112 in first direction X can be larger than the size of the cut isolation structure 120 exposed in the gate trench 115 in first direction X.

After the thinning process is performed on the sidewall of the initial cut isolation structure 110 exposed in the gate trench 115, the channel mask layer 105 can be removed.

Figure 10:
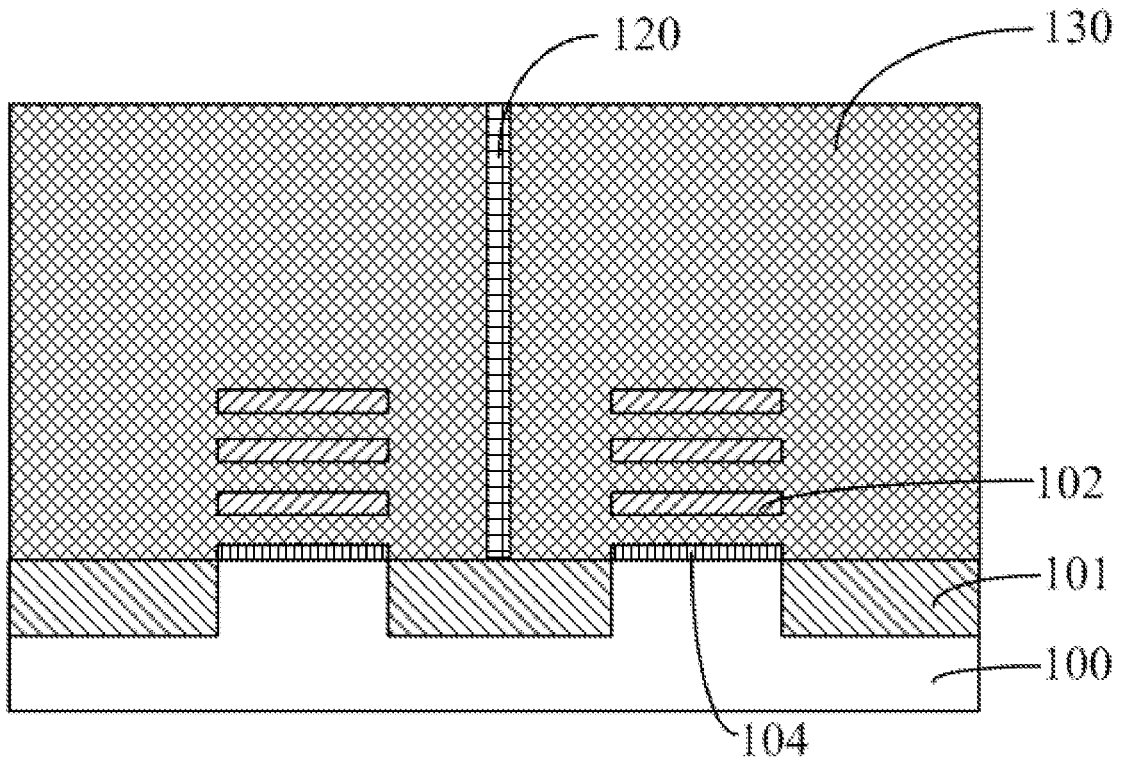

As shown in FIG. 11, a plurality of gates are formed in the gate trenches (S110). FIG. 10 illustrates the corresponding structure.

With reference to FIG. 10, FIG. 10 has a view in the same direction as FIG. 8. After the thinning process, a plurality of gates 130 are formed in the gate trenches 115.

Before the gate 130 is formed, the formation process can further include removing the sacrificial layer 103 exposed by the gate trench 115 to form a gate gap. Thus, the gate 130 can be still located in the gate gap.

Since the channel layer 102 is stacked thin nanosheets, and the gate 130 is also located in the gate gap, the formed gate 130 can surround surfaces of the channel layer 102. Thus, the current of the channel layer 102 can be better controlled to reduce leakage, and the performance of the small-size device can be improved to further improve the integration of the devices.

Correspondingly, the present disclosure further provides a semiconductor structure.

With still reference to FIG. 10, the semiconductor structure includes a substrate, a plurality of gates 130 formed on the substrate, a cut isolation structure 120 formed on the substrate, and an interlayer dielectric layer formed on the substrate. The plurality of gates 130 extend along the first direction. The cut isolation structure 120 passes through the gates 130 along the second direction. A size of the cut isolation structure 120 in the first direction is equal to the predetermined size. The second direction is different from the first direction. The interlayer dielectric layer surrounds the gates 130 and the cut isolation structure 120.

In some embodiments, the predetermined size can be less than or equal to 4 nanometers.

In some embodiments, the first direction and the second direction can be perpendicular to each other. The first direction and the second direction can be parallel to the surface of the substrate.

In some embodiments, the substrate can include a base substrate 100 and a channel structure formed on the base substrate 100. A gate 130 of the plurality of gates 130 can cross over the channel structure. The channel structure can extend along the second direction.

In some embodiments, the channel structure can include a plurality of stacked channel layers 102. A gate gap can exist between two neighboring channel layers 102.

In some embodiments, the gate 130 can be formed in the gate gap between the two neighboring channel layers 102.

In some embodiments, a part of the cut isolation structure 120 can be also located in the interlayer dielectric layer. The size of the cut isolation structure 120 in the interlayer dielectric layer in the first direction can be larger than the size of the cut isolation structure 120 in the gate 130 in the first direction.

Although the present disclosure is disclosed above, the present disclosure is not limited here. Those skilled in the art can make various changes and modifications without departing from the spirit and scope of the present disclosure. Thus, the scope of the present invention should be subjected to the scope defined in the claims.

What is claimed is:

1. A semiconductor structure, comprising:
   a substrate;
   a plurality of gates formed on the substrate, the plurality of gates extending along a first direction;
   a cut isolation structure formed on the substrate, the cut isolation structure passing through the gates along a second direction, a size of the cut isolation structure in the first direction being equal to a predetermined size that is less than or equal to 4 nanometers, and the second direction being different from the first direction; and
   an interlayer dielectric layer formed on the substrate and surrounding the gates and the cut isolation structure.

2. The semiconductor structure according to claim 1, wherein:
   the first direction and the second direction are perpendicular to each other; and
   the first direction and the second direction are parallel to a surface of the substrate.

3. The semiconductor structure according to claim 1, wherein the substrate includes:
   a base substrate;
   a channel structure formed on the base substrate, the gates crossing over the channel structure, and the channel structure extending along the second direction.

4. The semiconductor structure according to claim 3, wherein the channel structure includes:
   a plurality of stacked channel layers, a gate gap existing between two neighboring channel layers.

5. The semiconductor structure according to claim 4, wherein a gate of the plurality of gates is further located in the gate gap between the channel layers.

6. A semiconductor structure comprising:
   a substrate;
   a plurality of gates formed on the substrate, the plurality of gates extending along a first direction;
   a cut isolation structure formed on the substrate, the cut isolation structure passing through the gates along a second direction, a size of the cut isolation structure in the first direction being equal to a predetermined size, and the second direction being different from the first direction; and
   an interlayer dielectric layer formed on the substrate and surrounding the gates and the cut isolation structure, wherein:
   a part of the cut isolation structure is also formed in the interlayer dielectric layer; and
   a size of the cut isolation structure in the interlayer dielectric layer in the first direction is larger than a size of the cut isolation structure in the gate in the first direction.

7. The semiconductor structure according to claim 6, wherein the substrate includes:
   a base substrate;
   a channel structure formed on the base substrate, the gates crossing over the channel structure, and the channel structure extending along the second direction.

8. The semiconductor structure according to claim 7, wherein the channel structure includes a plurality of stacked channel layers, a gate gap existing between two neighboring channel layers, and a gate of the plurality of gates is further located in the gate gap between the channel layers.

9. A formation method of a semiconductor structure, comprising:
   providing a substrate;
   forming a plurality of dummy gates, an interlayer dielectric layer, and an initial cut isolation structure on the substrate, the dummy gates extending along a first direction, the initial cut isolation structure passing through the dummy gates along a second direction, the second direction is different from the first direction, and the interlayer dielectric layer surrounding the dummy gates and the initial cut isolation structure;
   removing the dummy gates, and forming a gate trench in the interlayer dielectric layer;
   performing a thinning process on a sidewall of the initial cut isolation structure exposed in the gate trench to form a cut isolation structure, a size of a part of the cut isolation structure located in the gate trench along the first direction reaching a predetermined size that is less than or equal to 4 nanometers; and after the thinning process, forming a plurality of gates in gate trenches.

10. The method according to claim 9, wherein the substrate includes:

a base substrate;

a channel structure formed on the base substrate and including:

a plurality of sacrificial layers; and a channel layer formed between two neighboring sacrificial layers.

11. The method according to claim 10, further comprising, after the thinning process and before forming the gates, removing a sacrificial layer exposed by the gate trench to form a gate gap.

12. The method according to claim 11, wherein the gate is also formed in the gate gap.

13. The method according to claim 9, wherein the initial cut isolation structure is formed before the dummy gates and the interlayer dielectric layer are formed.

14. The method according to claim 13, wherein forming the dummy gates, the interlayer dielectric layer, and the initial cut isolation structure includes:

forming a dummy gate material layer on the substrate;

forming a cut trench extending along the second direction in the dummy gate material layer;

forming the initial cut isolation structure in the cut trench;

patterning the dummy gate material layer to form the plurality of dummy gates extending along the first direction; and forming the interlayer dielectric layer surrounding the dummy gates and the initial cut isolation structure on the substrate.

15. The method according to claim 14, wherein a size of the cut trench along the first direction ranges from 4 nanometers to 40 nanometers.

16. The method according to claim 14, wherein:

the cut trench is formed between two channel structures; and distances from the two channel structures neighboring to the cut trench to a sidewall of the cut trench are equal.

17. The method according to claim 14, wherein forming the cut trench includes:

forming a mask layer exposing a part of the dummy gate material layer on the dummy gate material layer; and using the mask layer as a mask to etch the dummy gate material layer by an anisotropic dry etching process to form the cut trench.

18. The method according to claim 9, wherein the initial cut isolation structure is formed after the dummy gates and the interlayer dielectric layer are formed.

19. The method according to claim 9, wherein a distance between two channel structures in the first direction ranges from 10 nanometers to 30 nanometers.

20. The method according to claim 9, wherein performing the thinning process on the sidewall of the initial cut isolation structure in the gate trench includes a wet etching process or an isotropic dry etching process.

* * * * *